United States Patent [19]

Neidig et al.

[11] Patent Number: 4,591,401
[45] Date of Patent: May 27, 1986

[54] PROCESS FOR THE DIRECT BONDING OF METAL TO CERAMICS

[75] Inventors: Arno Neidig, Plankstadt; Klaus Bunk; Karl-Heinz Thiele, both of Worms; Georg Wahl, Eppelheim; Jens Gobrecht, Gebenstorf, all of Fed. Rep. of Germany

[73] Assignee: Brown, Boveri & Cie Aktiengesellschaft, Mannheim, Fed. Rep. of Germany

[21] Appl. No.: 625,722

[22] Filed: Jun. 28, 1984

[30] Foreign Application Priority Data

Jul. 8, 1983 [DE] Fed. Rep. of Germany ....... 3324661

[51] Int. Cl.$^4$ ...................... B32B 31/06; B32B 31/12; B32B 31/22
[52] U.S. Cl. ..................................... 156/89; 156/257; 228/122; 228/188; 228/195; 228/903
[58] Field of Search ............................ 156/87, 89, 257; 228/122, 188, 195, 903

[56] References Cited

U.S. PATENT DOCUMENTS

| 3,034,202 | 5/1962 | Graves | 228/122 |
| 3,766,634 | 10/1973 | Babcock et al. | 228/188 |
| 3,911,553 | 10/1975 | Burgess et al. | 228/195 |
| 3,970,235 | 7/1976 | Blust et al. | 228/122 |
| 3,994,430 | 11/1976 | Cusano et al. | 228/122 |

FOREIGN PATENT DOCUMENTS 2099742 12/1982 United Kingdom ................. 156/87

Primary Examiner—Caleb Weston
Attorney, Agent, or Firm—Herbert L. Lerner; Laurence A. Greenberg

[57] ABSTRACT

In directly bonding a metal to ceramics, in accordance with the invention, that surface of a metal component which is to be bonded by heating to a ceramic substrate is provided with parallel-running grooves before the preoxidation. The grooves make it possible to optimize the quantity of oxygen available at the bonding location and provide good flow behavior of the melt. As a result, a bond with good adhesion is obtained. Moreover, there is no formation of a thicker oxide layer on the free smooth surface of the metal component.

4 Claims, 2 Drawing Figures

PROCESS FOR THE DIRECT BONDING OF METAL TO CERAMICS

BACKGROUND OF THE INVENTION

1. Field of the Invention

The invention relates to a process for directly bonding a metal component, the surface of which is covered by an oxide layer, to a ceramic substrate, by heating the ceramic substrate with the metal component placed thereon, up to a temperature above the eutectic point of the metal and metal oxide but below the melting point of the metal. The process can be used, for example, for bonding copper foils, in particular large-area foils.

2. Description of the Prior Art

Process for the direct bonding of metal to ceramics have been disclosed in German published specifications No. 2,633,869, No. 2,319,854 and No. 2,508,244 (corresponding to U.S. Pat. Nos. 3,994,430, 3,766,634 and 3,911,553, respectively).

In German published specification No. 2,633,869, a process has been described in which an oxidized copper foil and an oxide-ceramic substrate are heated in an inert atmosphere at a temperature between the eutectic point of copper and copper oxide and the melting point of copper, until a sub-eutectic melt between the copper and the substrate has formed. The heating in an inert atmosphere, however, does not give the desired strong adhesive bond between the copper and the ceramic, since, at the given process temperatures, $Cu_2O$ is reduced to Cu, which does not bond to ceramics, unless a defined minimum oxygen partial pressure is maintained. In the published specification quoted, it is also proposed to use an oxygen-containing copper material without an oxide coating, in place of preoxidized copper. Apart from the fact that even here a bond between the copper and the ceramics cannot be formed, unless a minimum oxygen partial pressure is maintained in the furnace atmosphere, tests have shown that the oxygen dissolved in the metal diffuses to the contact face between the copper and the ceramic and remains occluded there; this leads to the formation of blisters and hence to a defective bond between the metal and the ceramic.

The process described in German published specification No. 2,319,854 differs from that just described in that a bright metal foil, in particular of copper, which has not been preoxidized, is to be bonded to the oxide-ceramic substrate in a reactive atmosphere, in particular an atmosphere containing oxygen. In this process, the oxygen in the atmosphere must first oxidize the copper superficially, before the actual bonding process can proceed. It has been found, however, that, in particular in the case of large-area bonds between ceramics and copper, the oxygen cannot penetrate in an adequate quantity into the gap between the ceramics and copper, so that blister-like points without adhesion result. Moreover, there is a risk of the copper foil, at the indicated quantities of oxygen, being coated with a thick black copper oxide layer on the side facing away from the ceramic substrate, and this coating has to be removed in an additional working step, before further processing is possible.

In the process described in German published specification No. 2,508,244, a preoxidized copper foil is initially bent in such a way that it is placed only gradually onto the ceramic substrate during heating. In this way, any gas bubbles are intended to be forced out outwards. This process is expensive and involved, and it is not always applicable if the shapes of the metal components or of the ceramics are complicated, or the metal component does not place itself uniformly onto the substrate. Moreover, event with the quantity of oxygen indicated in the published specification, the copper surface not resting on the substrate is covered with a thick black oxide layer which afterwards must be removed.

SUMMARY OF THE INVENTION

It is an object of the present invention to provide a further development of the known processes, in which a virtually blister-free bond between a metal component and a ceramic substrate is obtained in a simple manner and, at the same time, an oxide layer on the surface not bonded to the substrate is avoided or minimized.

With the foregoing and other objects in view, there is provided in accordance with the invention a process for directly bonding a metal component, the surface of which is covered by an oxide layer after preoxidation, to a ceramic substrate, which comprises placing the metal component covered by an oxide layer on the ceramic substrate, heating the ceramic substrate with the metal component placed thereon to a temperature above the eutectic point of the metal and metal oxide but below the melting point of the metal, the combination therewith of forming parallel grooves, before said preoxidation on the surface of the metal component which is to be bonded to the ceramic substrate, and then effecting said heating to make the metal/ceramic bond.

Other features which are considered as characteristic for the invention are set forth in the appended claims.

Although the invention is illustrated and described herein as embodied in a process for the direct bonding of metal to ceramics, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

DETAILED DESCRIPTION OF THE INVENTION

In directly bonding a metal to ceramics, in accordance with the invention, that surface of a metal component which is to be bonded by heating to a ceramic substrate is provided with parallel-running grooves before the preoxidation. The grooves make it possible to optimize the quantity of oxygen available at the bonding location and provide good flow behavior of the melt. As a result, a bond with good adhesion is obtained. Moreover, there is no formation of a thicker oxide layer on the free smooth surface of the metal component.

An advantageous result of parallel grooves on one side of the metal component is that, during the bonding process, more oxide is available on the metal side to be bonded to the substrate than on the free back of the metal component. This not only leads to a good bond, but also after-treatment of the free metal side becomes superfluous. A further advantage is that the bond can be made either in a vacuum furnace or in a continuous furnace, with or without additional oxygen being supplied.

Figure 1:
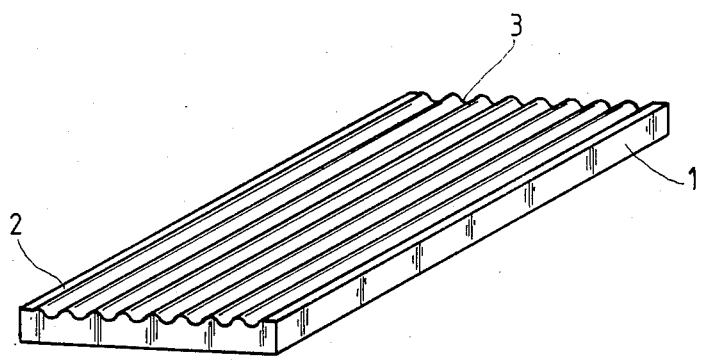
FIG. 1 shows a metal component with one side with parallel grooves.

The invention is further explained by reference to an illustrative embodiment and to the drawings, as follows:

FIG. 1 illustrates a metal component 1 which, for example, can be a copper foil. The surface 2 which is to be bonded to ceramics is roughened by means of striations or grooves 3 which run in parallel. This roughening can be carried out before the metal component 1 is punched out of a larger sheet, for example by means of a brush, or even after the metal component 1 has been produced, for example by grinding. Grooves of a depth and width of about 3 to 10 μm are particularly suitable.

Figure 2:
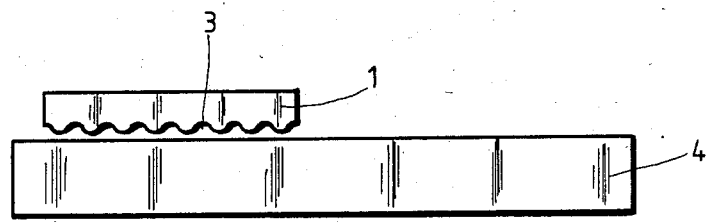
FIG. 2 shows a metal component placed onto a ceramic substrate.

The metal component 1 is preoxidized and placed, with the roughened side facing downwards, onto a ceramic substrate 4, as shown in FIG. 2. The thickness of the oxide layer is selected or optimized in accordance with the further process. The oxide layer can be very thin, if the bonding is carried out in a continuous furnace with a supply of small quantities of oxygen. A continuous furnace is a furnace through which a ceramic substrate with a metal component placed thereon pass continuously and during such passage are heated to effect bonding of the component to the substrate. A vacuum furnace is a furnace wherein a ceramic substrate covered by a metal component is heated under a vacuum to effect bonding of the metal component and ceramic substrate. With an appropriately optimized oxide layer, however, the bond can also be made in an advantageous manner in a continuous furnace without oxygen supply. The greater quantity of oxygen available, due to the grooves 3, between the surfaces, which are to be bonded, of the metal component 1 and the ceramic substrate 4, is then sufficient for perfect bonding. Bonding in a vacuum furnace can also be accomplished.

The mode of action of the grooves will now be explained. As is generally known, the metal/oxygen mixture must reach the state of a molten phase for direct bonding of the metal to ceramics. To form this phase, a defined oxygen partial pressure depending on the temperature is necessary. The thickness of the melt here is dependent on the available oxygen, that is to say the more oxygen available, for example in the form of an oxide layer, the thicker the melt becomes. The thickness of the melt is optimized if points of defective contacting due to blister formation are to be avoided. Both excessively thick and excessively thin layers of the melt lead to unsatisfactory bonding.

The grooves 3 on the surface 2 of the metal component 1 which is to be bonded to the ceramic substrate 4 have the result that, after the preoxidation, more oxide is present on the area thus enlarged than on the smooth back. By shaping the grooves 3 and selection of the optimum oxide layer thickness, adequate oxygen is provided and no additional oxygen supply is necessary for bonding. The thickness of the oxide layer is generally within the range of about 0.5 to about 1.5 μm. Adjustment to optimize the available oxygen, by changing the thickness of the oxide layer or the shape of the grooves is simply and easily accomplished by preliminarily running a few sample bondings and as a result thereof, if necessary, making the adjustment and continuing the operations thereafter on an adjusted or optimized basis. Moreover, the grooves 3 running in parallel provide good flow behavior of the molten liquid, so that virtually bubble-free wetting results. Due to the relatively small quantity of oxygen available on the smooth side of the metal component, no thicker oxide layer is formed there.

There is claimed:

1. A method of bonding a metal component to a ceramic substrate, which comprises, forming a plurality of parallel grooves of a depth and width of 3 to 10 μm on the surface of the metal component which is to be bonded to the ceramic substrate producing a grooved metal surface of enlarged area compared to the area of the surface prior to grooving, thereafter preoxidizing the groove metal surface including the grooves to form an oxide layer covering the grooved metal surface of enlarged area, placing the metal component on the ceramic substrate with the grooved metal surface of enlarged area covered with an oxide layer in contact with the ceramic substrate, and heating the ceramic substrate with the metal component placed thereon to a temperature above the eutectic point of the metal and metal oxide but below the melting point of the metal to effect bonding of the metal component to the ceramic substrate.

2. A process as claimed in claim 1, wherein the metal/ceramic bonding is carried out in a vacuum furnace.

3. A process as claimed in claim 1, wherein the metal/ceramic bonding is carried out in a continuous furnace.

4. A process as claimed in claim 3, wherein the bond is made with oxygen being supplied.

* * * * *